United States Patent
Sasaki

(10) Patent No.: US 12,543,504 B2
(45) Date of Patent: Feb. 3, 2026

(54) PIEZOELECTRIC ELEMENT

(71) Applicant: TDK Corporation, Tokyo (JP)

(72) Inventor: Satoshi Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 988 days.

(21) Appl. No.: 17/762,831

(22) PCT Filed: Dec. 18, 2020

(86) PCT No.: PCT/JP2020/047526
§ 371 (c)(1),
(2) Date: Mar. 23, 2022

(87) PCT Pub. No.: WO2021/132098
PCT Pub. Date: Jul. 1, 2021

(65) Prior Publication Data
US 2022/0416147 A1  Dec. 29, 2022

(30) Foreign Application Priority Data
Dec. 23, 2019 (JP) ................. 2019-231701

(51) Int. Cl.
*H10N 30/87* (2023.01)
*H10N 30/50* (2023.01)

(52) U.S. Cl.
CPC ............. *H10N 30/87* (2023.02); *H10N 30/50* (2023.02)

(58) Field of Classification Search
CPC ............... H10N 30/50; H10N 30/87

USPC ......................................................... 310/328
See application file for complete search history.

(56) References Cited

U.S. PATENT DOCUMENTS

| | | | |
|---|---|---|---|
| 2008/0239020 A1* | 10/2008 | Sugahara | B41J 2/14233 310/357 |
| 2009/0243440 A1 | 10/2009 | Kimura et al. | |
| 2016/0056366 A1 | 2/2016 | Nakamura | |

FOREIGN PATENT DOCUMENTS

| | | |
|---|---|---|
| JP | 2002-218771 A | 8/2002 |
| JP | 2007-335664 A | 12/2007 |
| JP | 2015-072979 A | 4/2015 |
| WO | 2008/078487 A1 | 7/2008 |
| WO | 2015/060132 A1 | 4/2015 |

OTHER PUBLICATIONS

Mar. 9, 2021 International Search Report issued in International Patent Application No. PCT/JP2020/047526.
Jun. 28, 2022 International Preliminary Report on Patentability issued in International Patent Application No. PCT/JP2020/047526.

* cited by examiner

*Primary Examiner* — Derek J Rosenau
(74) *Attorney, Agent, or Firm* — Oliff PLC

(57) ABSTRACT

A piezoelectric element includes a piezoelectric body containing a piezoelectric ceramic material, and a first electrode and a second electrode disposed on the piezoelectric body to oppose each other. A stress received by the piezoelectric body from the first electrode is larger than a stress received by the piezoelectric body from the second electrode. A polarization direction of the piezoelectric body is a direction directed from the first electrode toward the second electrode.

8 Claims, 5 Drawing Sheets

(b)

(a)

PIEZOELECTRIC ELEMENT

TECHNICAL FIELD

The present invention relates to a piezoelectric element.

BACKGROUND ART

Known piezoelectric elements include a piezoelectric body containing a piezoelectric ceramic material and a pair of electrodes disposed on the piezoelectric body (for example, refer to Patent Literature 1 and Patent Literature 2). The pair of electrodes are disposed on the piezoelectric body to oppose each other. An electric field is applied to the piezoelectric body through the pair of electrodes.

CITATION LIST

Patent Literature

Patent Literature 1: International Publication No. 2008/078487
Patent Literature 2: International Publication No. 2015/060132

SUMMARY OF INVENTION

Technical Problem

An object of an aspect of the present invention is to provide a piezoelectric element that realizes a large displacement amount and has high reliability.

Solution to Problem

The present inventors conducted thorough research on a piezoelectric element that realizes a large displacement amount and has high reliability. As a result, the present inventors newly obtained the following findings, and have accomplished the present invention.

For example, an electric field is applied to a piezoelectric body through a pair of electrodes disposed on the piezoelectric body to perform polarization treatment. Due to the polarization treatment, a predetermined ion in a crystal structure included in the piezoelectric body migrates, and a polarization direction in each domain that exists in the piezoelectric body is aligned. For example, the predetermined ion is a B ion in a perovskite crystal structure expressed by $ABO_X$. In which case, when a total amount of B ions that migrate to a predetermined position is larger, the piezoelectric body is satisfactorily polarized. In a configuration where the piezoelectric body is satisfactorily polarized, piezoelectric characteristics are high. The piezoelectric body in which the B ion migrates to the predetermined position in each domain and polarization is aligned to a predetermined direction is in an appropriate polarization state.

Easiness of migration of the predetermined ion is different depending on a stress applied to the piezoelectric body from the electrodes disposed on the piezoelectric body. For example, in a configuration where a stress from one of the pair of electrodes applying an electric field to the piezoelectric body is larger than a stress from the other electrode, the predetermined ion tends not to migrate toward the one electrode, and tends to migrate toward the other electrode.

Therefore, a piezoelectric element that realizes the following configuration obtains large polarization. A stress received by a piezoelectric body from one electrode is different from a stress received by the piezoelectric body from the other electrode. A polarization direction is set as a direction directed from the one electrode toward the other electrode. As obtained polarization is larger, the piezoelectric element realizes a large displacement amount. As the obtained polarization is larger, even in the case of being used under a situation in which a voltage is applied in a direction opposite to the polarization direction, the piezoelectric element tends not to lose polarization. That is, the piezoelectric element has high reliability.

A piezoelectric element according to one aspect includes a piezoelectric body containing a piezoelectric ceramic material, and a first electrode and a second electrode disposed on the piezoelectric body to oppose each other. A stress received by the piezoelectric body from the first electrode is larger than a stress received by the piezoelectric body from the second electrode. A polarization direction of the piezoelectric body is a direction directed from the first electrode toward the second electrode In the one aspect, the stress received by the piezoelectric body from the first electrode is larger than the stress received by the piezoelectric body from the second electrode, and the polarization direction of the piezoelectric body is a direction directed from the first electrode toward the second electrode. Therefore, the one aspect realizes a large displacement amount and has high reliability.

In the one aspect, a coverage rate of the first electrode may be larger than a coverage rate of the second electrode. In this case, a configuration where the stress received by the piezoelectric body from the first electrode is larger than the stress received by the piezoelectric body the second electrode is realized in a simple and reliable manner.

In the one aspect, the piezoelectric body may include a surface that is in contact with the first electrode and includes a sintered surface, and a surface that is in contact with the second electrode and includes a sintered surface. In this case, releasing of ceramics from the piezoelectric body is controlled, and the piezoelectric body is covered with the first electrode and the second electrode in an appropriate covering state.

Advantageous Effects or Invention

One aspect of the present invention provides a piezoelectric element that realizes a large displacement amount and has high reliability.

DESCRIPTION OF EMBODIMENTS

Figure 1:
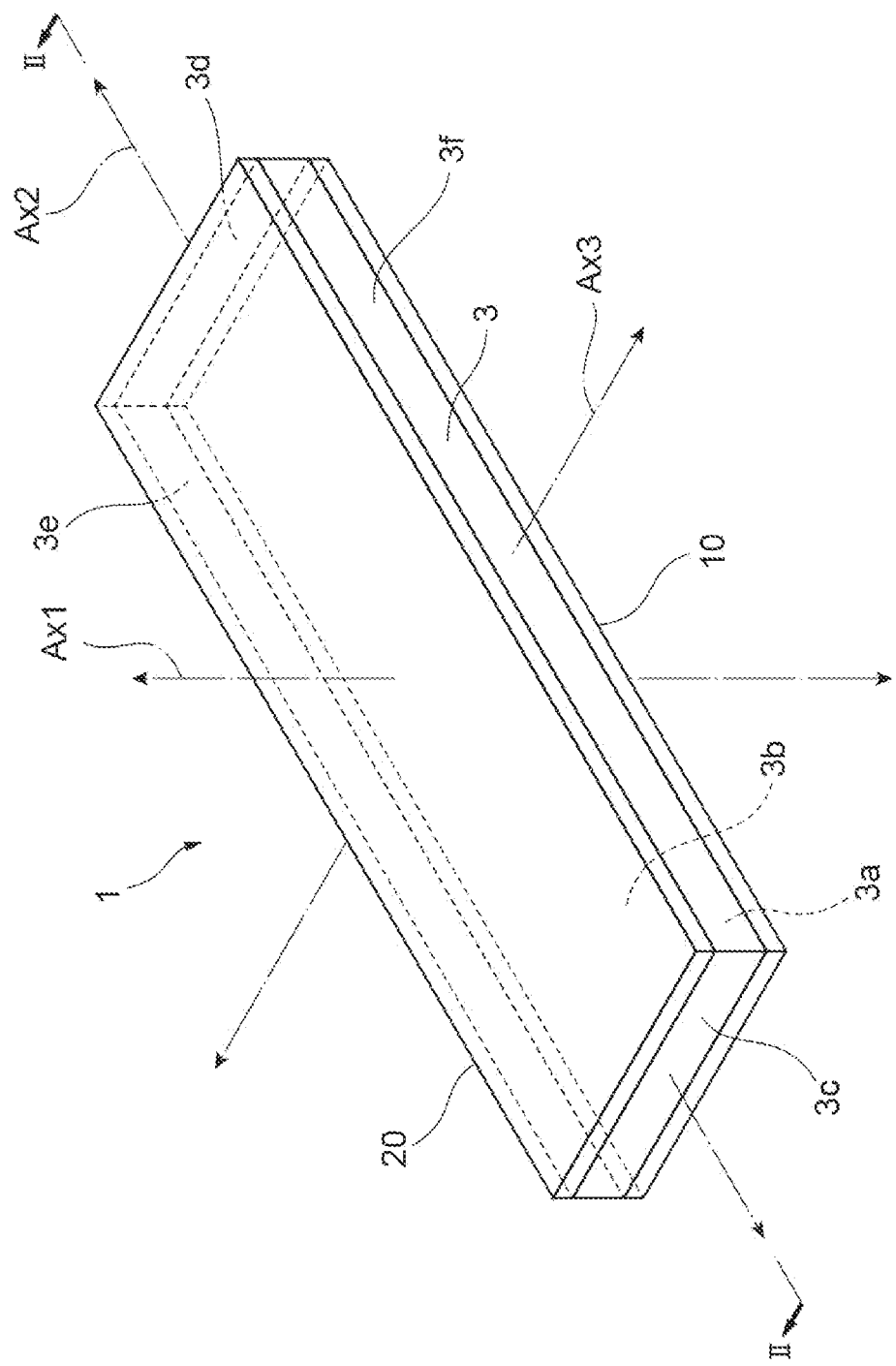
FIG. 1 is a perspective view illustrating a piezoelectric element according to a first embodiment.

Hereinafter, embodiments of the present invention will be described in detail below with reference to the accompanying drawings. In the following description, the same elements or elements having the same functions will be denoted with the same reference numerals and overlapped explanation will be omitted.

First Embodiment

Figure 2:
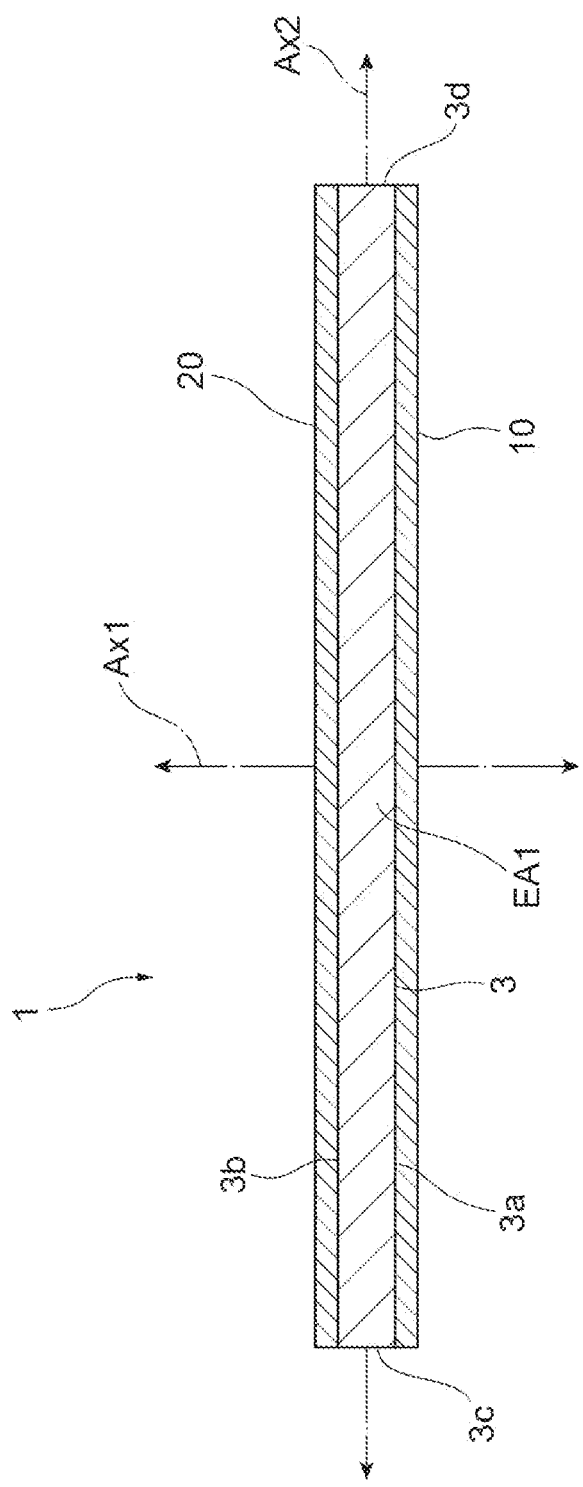
FIG. 2 is a cross-sectional view taken along line II-II of FIG. 1.

A configuration of a piezoelectric element 1 according to the first embodiment will be described with reference to FIG. 1 and FIG. 2. FIG. 1 is a perspective view illustrating a piezoelectric element according to the first embodiment. FIG. 2 is a cross-sectional view taken along line II-II of FIG. 1.

The piezoelectric element 1 includes a piezoelectric body 3 and a first electrode 10 and a second electrode 20 disposed on the piezoelectric body 3. The first electrode 10 and the second electrode 20 oppose each other in a first direction Ax1. The first electrode 10 and the second electrode 20 are configured to apply an electric field to the piezoelectric body 3. The piezoelectric element 1 is used, for example, in a hard disk drive. The piezoelectric element 1 is used, for example, in a second actuator other than a voice coil motor provided in a dual actuator type hard disk drive.

The piezoelectric body 3 contains a piezoelectric ceramic material. The piezoelectric body 3 is, for example, constituted by a sintered body of a piezoelectric ceramic material. The piezoelectric ceramic material includes PZT [Pb(Zr, Ti)O$_3$], PT (PbTiO$_3$), PLZT [(Pb, La) (Zr, Ti)O$_3$], or barium titanate (BaTiO$_3$). These piezoelectric ceramic materials are oxides having a perovskite-type crystal structure represented by a general formula ABO$_X$.

The piezoelectric body 3 has a rectangular parallelepiped shape. The piezoelectric body 3 includes a first main surface 3a and a second main surface 3b that oppose each other. The first main surface 3a and the second main surface 3b oppose each other in the first direction Ax1. The first main surface 3a and the second main surface 3b are parts of an outer surface of the piezoelectric body 3. The piezoelectric body 3 is, for example, configured such that a plurality of piezoelectric layers is laminated. The piezoelectric body 3 is, for example, constituted by a ceramic green sheet sintered body containing a piezoelectric ceramic material. A direction in which the piezoelectric layers are laminated is a direction along the first direction Ax1. In an actual piezoelectric body 3, the piezoelectric layers are integrated to a certain extent in which a boundary between the piezoelectric layers cannot be visually recognized. A length of the piezoelectric body 3 along the first direction Ax1 is, for example, approximately 0.08 mm. The first direction Ax1 is, for example, a thickness direction of the piezoelectric body 3. In the present specification, the rectangular parallelepiped shape includes a rectangular parallelepiped shape in which corners and ridges are chamfered, or a rectangular parallelepiped shape in which corners and ridges are rounded.

The piezoelectric body 3 includes a first end surface 3c and a second end surface 3d that oppose each other. The first end surface 3c and the second end surface 3d oppose each other in a second direction Ax2 intersecting the first direction Ax1. The first end surface 3c and the second end surface 3d are parts of the outer surface of the piezoelectric body 3. The second direction Ax2 is, for example, a longitudinal direction of the piezoelectric body 3. A length of the piezoelectric body 3 along the second direction Ax2 is, for example, approximately 1.1 mm.

The piezoelectric body 3 includes a first side surface 3e and a second side surface 3f that oppose each other. The first side surface 3e and the second side surface 3f oppose each other in a third direction Ax3 that intersects the first direction Ax1 and the second direction Ax2. The first side surface 3e and the second side surface 3f are parts of the outer surface of the piezoelectric body 3. The third direction Ax3 is, for example, a lateral direction of the piezoelectric body 3. A length of the piezoelectric body 3 along the third direction Ax3 is, for example, approximately 0.75 mm.

The first main surface 3a and the second main surface 3b extend in the second direction Ax2 to couple the first end surface 3c and the second end surface 3d. The first main surface 3a and the second main surface 3b extend in the third direction Ax3 to couple the first side surface 3e and the second side surface 3f.

The first end surface 3c and the second end surface 3d extend in the first direction Ax1 to couple the first main surface 3a and the second main surface 3b. The first end surface 3c and the second end surface 3d extend in the third direction Ax3 to couple the first side surface 3e and the second side surface 3f.

The first side surface 3e and the second side surface 3f extend in the second direction Ax2 to couple the first end surface 3c and the second end surface 3d. The first side surface 3e and the second side surface 3f extend in the first direction Ax1 to couple the first main surface 3a and the second main surface 3b.

In the present embodiment, the first electrode 10 is an external electrode disposed on the first main surface 3a. The first electrode 10 extends between an end edge of the first end surface 3c and an end edge of the second end surface 3d and extends between an end edge of the first side surface 3e and an end edge of the second side surface 3f on the first main surface 3a. The first electrode 10 may be disposed to cover the entirety of the first main surface 3a. The first electrode 10 is not disposed on the second main surface 3b, on the first end surface 3c, on the second end surface 3d, on the first side surface 3e, and on the second side surface 3f.

The first electrode 10 includes, for example, a Cr layer, a Ni—Cr alloy layer, and an Au layer that are laminated. In this case, the Cr layer is formed on the piezoelectric body 3, the Ni—Cr alloy layer is formed on the Cr layer, and the Au layer is formed on the Ni—Cr alloy layer. The Cr layer is a lower layer, the Ni—Cr alloy layer is an intermediate layer, and the Au layer is an upper layer. The first electrode 10 has a Cr/Ni—Cr/Au laminated structure. In the laminated structure in which the Cr layer is disposed as the lower layer, a stress on the piezoelectric body 3 is larger than that in a laminated structure in which the Cr layer is not disposed as the lower layer. The piezoelectric body 3 includes, near the first electrode 10, a portion where the stress received from the electrode is relatively large. In the present embodiment, the Ni—Cr alloy layer that is the intermediate layer may be a Ni—Cu layer. The first electrode 10 may be, for example, a Ni—Cr alloy layer, an Au layer, a Cr layer, or a Ni layer, as long as the stress received by the piezoelectric body 3 from the first electrode 10 is greater than the stress received by the piezoelectric body 3 from the second electrode 20. The first electrode 10 may have a single-layer structure.

In a case where the first electrode 10 has a laminated structure, for example, a thickness of the Cr layer is 50 nm to 200 nm, and a thickness of the Ni—Cr alloy layer is 20 nm to 400 nm. A thickness of the Au layer is, for example, 50 nm to 200 nm. In a case where the first electrode 10 has a single-layer structure, a thickness of the first electrode 10 is, for example, 120 nm to 800 nm.

In the present embodiment, the second electrode 20 is an external electrode disposed on the second main surface 3b. The second electrode 20 extends between an end edge of the first end surface 3c and an end edge of the second end surface 3d and extends between an end edge of the first side surface 3e and an end edge of the second side surface 3f on the second main surface 3b. The second electrode 20 may be disposed to cover the entirety of the second main surface 3b. The second electrode 20 is not disposed on the first main surface 3a, the first end surface 3c, the second end surface 3d, the first side surface 3e, and the second side surface 3f.

The second electrode 20 includes, for example, a Ni—Cr alloy layer and an Au layer that are laminated. In this case, the Ni—Cr alloy layer is formed on the piezoelectric body 3, and the Au layer is formed on the Ni—Cr alloy layer. The Ni—Cr alloy layer is a lower layer and the Au layer is an upper layer. The second electrode 20 has a Ni—Cr/Au laminated structure. In this laminated structure, a stress on the piezoelectric body 3 is smaller than that in a Cr/Ni—Cr/Au laminated structure in which a Cr layer is disposed as the lower layer. The piezoelectric body 3 includes, near the second electrode 20, a portion where the stress received from the electrode is relatively small. In the present embodiment, the Ni—Cr alloy layer that is the lower layer may be a Ni—Cu layer. The second electrode 20 may be, for example, a Ni—Cr alloy layer, an Au layer, a Cr layer, or a Ni layer, as long as the stress received by the piezoelectric body 3 from the second electrode 20 is smaller than the stress received by the piezoelectric body 3 from the first electrode 10. The second electrode 20 may have a single-layer structure.

In a case where the second electrode 20 has a laminated structure, for example, a thickness of the Ni—Cr alloy layer is 20 nm to 400 nm, and a thickness of the Au layer is 50 nm to 200 nm. In a case where the second electrode 20 has a single-layer structure, a thickness of the second electrode 20 is, for example, 70 nm to 600 nm. In the present embodiment, the piezoelectric body 3 is sandwiched between the first electrode 10 and the second electrode 20. The configuration where the first electrode 10 and the second electrode 20 sandwich the piezoelectric body 3, for example, reduces deformation of the piezoelectric body 3.

In the piezoelectric element 1, of the first electrode 10 and the second electrode 20, the first electrode 10 is made of a material having a relatively high hardness. The second electrode 20 is made of a material having a relatively low hardness. Accordingly, the stress received by the piezoelectric body 3 from the first electrode 10 is larger than the stress received by the piezoelectric body 3 from the second electrode 20. As a result, stresses received by the piezoelectric body 3 from the electrodes are different because of a difference in hardness between the electrodes disposed on the piezoelectric body 3.

The first electrode 10 and the second electrode 20 may be formed, for example, using a plating method. The plating method includes a sputtering method, a vapor deposition method, an electrolytic plating method, or a sintering method. In the present embodiment, the first electrode 10 and the second electrode 20 are plating layers.

The piezoelectric body 3 may include a surface that is in contact with the first electrode 10 and includes a sintered surface, and a surface that is in contact with the second electrode 20 and includes a sintered surface. The sintered surface forms a surface of the sintered body of the piezoelectric ceramic material, and includes a same surface construction as a natural surface. The natural surface is a surface constituted with surfaces of crystal grains grown through firing, and has an uneven structure. In the present embodiment, the first main surface 3a may constitute the surface that is in contact with the first electrode 10 and includes a sintered surface, and the second main surface 3b may constitute the surface that is in contact with the second electrode 20 and includes a sintered surface. In a configuration where a sintered surface is included in the piezoelectric body 3, releasing of ceramics from the piezoelectric body 3 is controlled, and the piezoelectric body 3 is covered with the first electrode 10 and the second electrode 20 in an appropriate covering state.

In the present embodiment, a coverage rate of the first electrode 10 is larger than a coverage rate of the second electrode 20. For example, the coverage rate of the first electrode 10 is 95 to 100, and the coverage rate of the second electrode 20 is 65 to 95. In this case, a configuration where stress received by the piezoelectric body 3 from the first electrode 10 is larger than stress received by the piezoelectric body 3 from the second electrode 20 is realized in a simple and reliable manner.

In a case where the first electrode 10 and the second electrode 20 are made of the same material, the first electrode 10 may have a thickness larger than that of the second electrode 20. For example, in a case where the first electrode 10 and the second electrode 20 are formed using a sputtering method, a vapor deposition method, or an electroplating method, a thickness of the first electrode 10 is 120 nm to 800 nm, and a thickness of the second electrode 20 is 70 nm to 600 nm. For example, in a case where the first electrode 10 and the second electrode 20 are formed using a baking method, a thickness of the first electrode 10 is 5 μm to 12 μm, and a thickness of the second electrode 20 is 2 μm to 7 μm. In these cases, a configuration where the stress received by the piezoelectric body 3 from the first electrode 10 is larger than the stress received by the piezoelectric body 3 from the second electrode 20 is realized in a simple and reliable manner.

The first electrode 10 and the second electrode 20 are configured to apply the electric field to the piezoelectric body 3. Therefore, the piezoelectric element 1 includes the first electrode 10 and the second electrode 20 that are a pair of electrodes for applying the electric field to the piezoelectric body 3. In the piezoelectric element 1, the piezoelectric body 3 includes an active region EA1 between the first electrode 10 and the second electrode 20. The active region EA1 is displaced in response to the electric field applied to the piezoelectric element 1.

Since the stress received by the piezoelectric body 3 from the second electrode 20 is relatively small, the second electrode 20 tends not to impede the displacement of the piezoelectric body 3. As a result, a displacement amount of the active region EA1 near the second electrode 20 tends to be large. Since the stress received by the piezoelectric body 3 from the first electrode 10 is relatively large, the first electrode 10 tends to impede the displacement of the piezoelectric body 3. As a result, a displacement amount of the active region EA1 near the first electrode 10 tends to be small. In the present embodiment, the stress received by the piezoelectric body 3 from the first electrode 10 is larger than the stress received by the piezoelectric body 3 from the second electrode 20.

A predetermined ion that migrates inside a crystal structure due to the polarization treatment tends to migrate from the first electrode 10 toward the second electrode 20 than from the second electrode 20 toward the first electrode 10. Accordingly, in a preparing process of the piezoelectric element 1, an electric field is applied to the piezoelectric body 3 such that a polarization direction of the active region EA1 is a direction directed from the first electrode 10 toward the second electrode 20. The predetermined ion is, for example, a B-site positive ion in the perovskite oxide represented by the general formula $ABO_X$.

The polarization treatment is, for example, performed at an ordinary temperature. The polarization treatment may be performed, for example, under a temperature environment of approximately 80° C. to 150° C. other than the ordinary temperature. That is, the piezoelectric body 3 may be heated. In a case where the polarization treatment is performed in a state in which the piezoelectric body 3 is being heated, when a polarization electric field is changed from an application state to a non-application state, a temperature of the piezoelectric body 3 may be an ordinary temperature. In this case, deterioration of polarization is reduced. The deterioration of polarization is caused by, for example, aging or driving of the piezoelectric element 1. In a case where the piezoelectric element 1 is driven, an electric field is applied to the piezoelectric element 1 (piezoelectric body 3) in a state where the first electrode 10 is a positive electrode and the second electrode 20 is a negative electrode.

As described above, in the present embodiment, the piezoelectric body 3 includes, between the first electrode 10 and the second electrode 20, two portions that are different from each other in the stress received from the electrodes. Of the two portions, one portion is a portion that receives the stress from the first electrode 10, and the other portion is a portion that receives the stress from the second electrode 20. The stress received by one portion from the first electrode 10 is greater than the stress received by the other portion from the second electrode 20.

The polarization direction of the piezoelectric body 3 is a direction directed from the first electrode 10 toward the second electrode 20. Therefore, in the present embodiment, a configuration is realized in which the polarization direction is a direction directed from the one portion that receives the stress from the first electrode 10 toward the other portion that receives the stress from the second electrode 20. As a result, the piezoelectric element 1 realizes the large amount of displacement and has high reliability.

Second Embodiment

Figure 3:
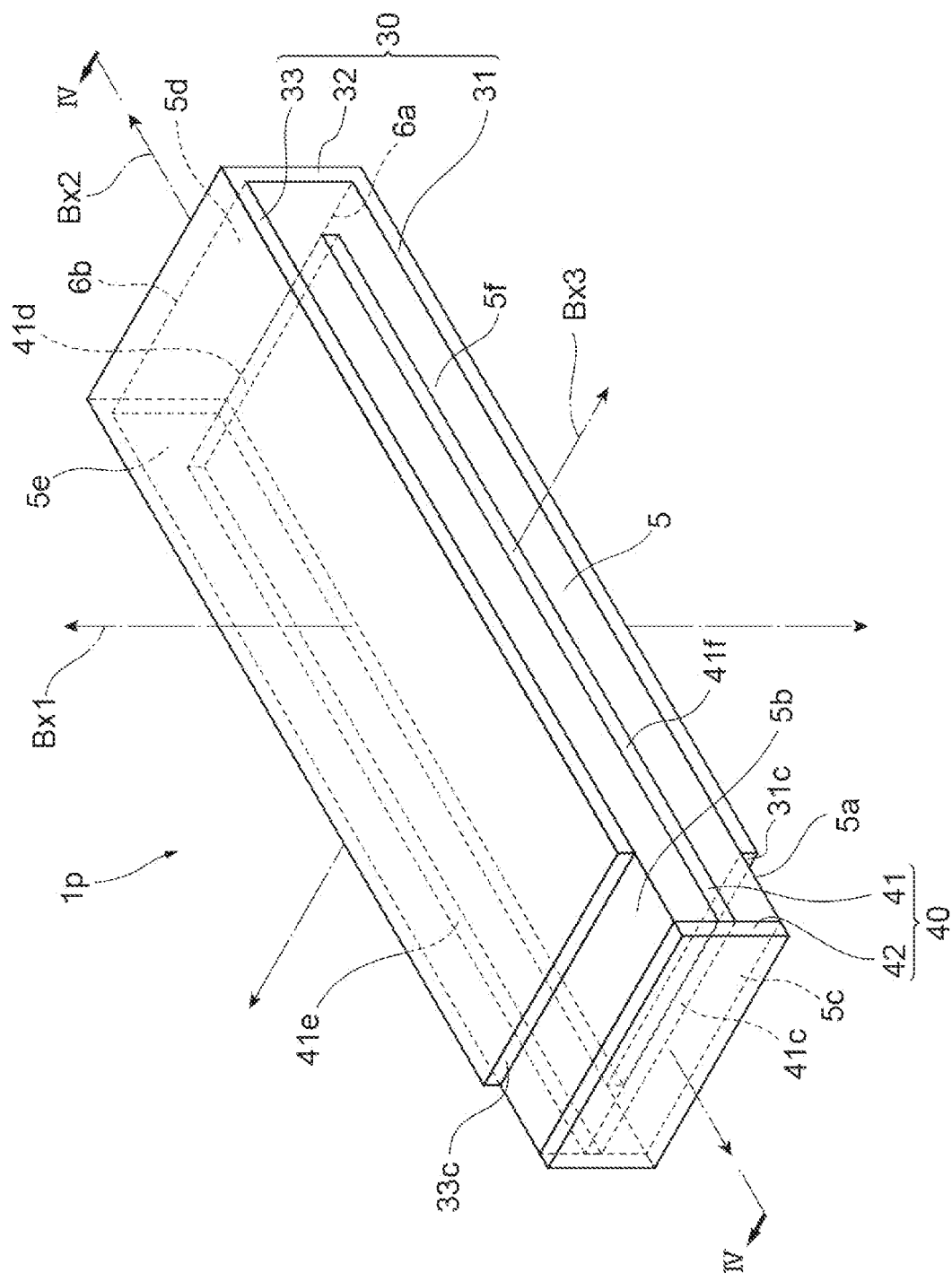
FIG. 3 is a perspective view illustrating a piezoelectric element according to a second embodiment.
Figure 4:
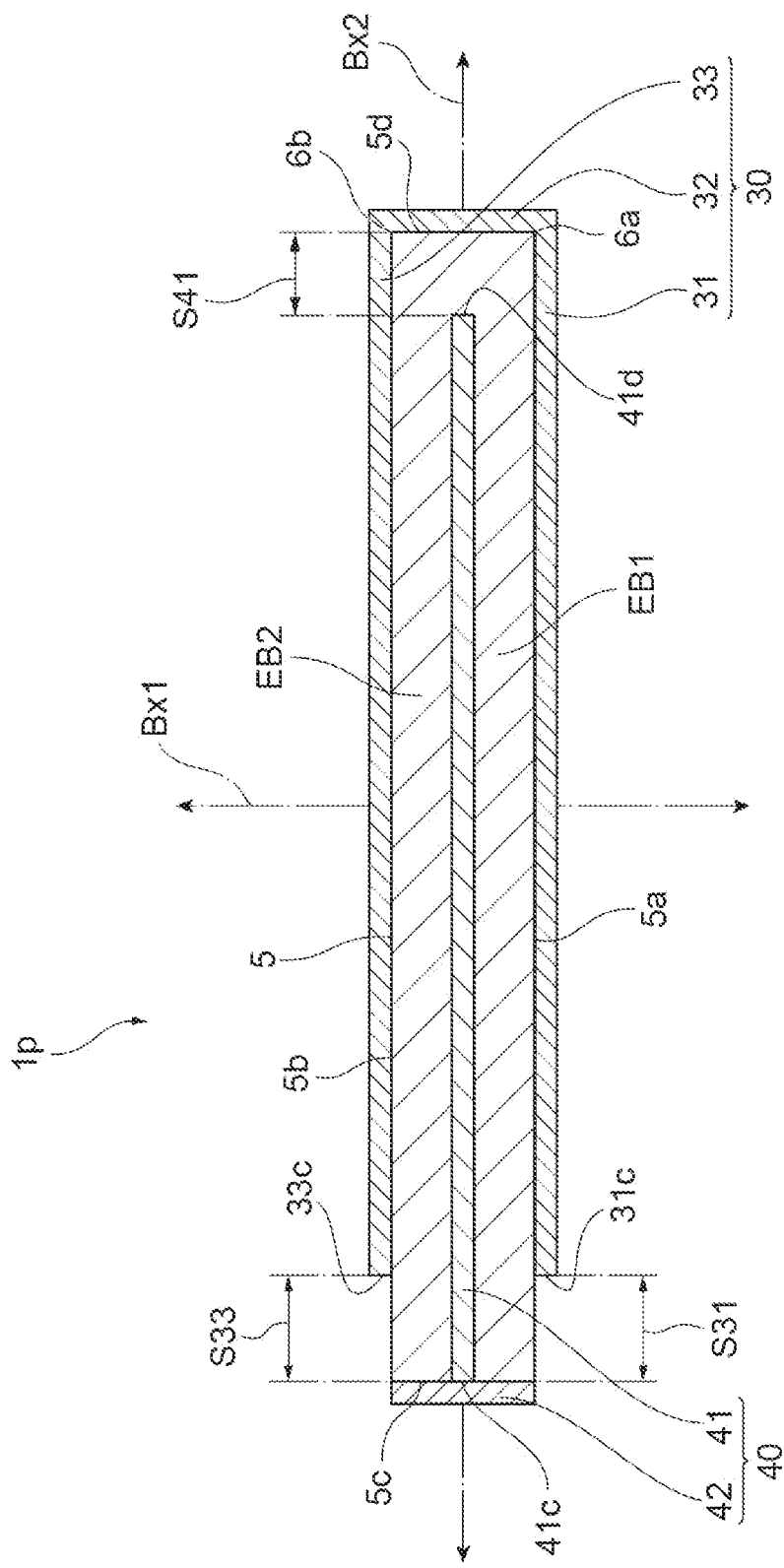
FIG. 4 is a cross-sectional view taken along line IV-IV of FIG. 3.

A configuration of a piezoelectric element 1p according to the second embodiment will be described with reference to FIG. 3 and FIG. 4. FIG. 3 is a perspective view illustrating the piezoelectric element according to the second embodiment. FIG. 4 is a cross-sectional view taken along line IV-IV of FIG. 3.

The piezoelectric element 1p includes a piezoelectric body 5, and a first electrode 30 and a second electrode 40 disposed on the piezoelectric body 5. The first electrode 30 and the second electrode 40 are configured to apply an electric field to the piezoelectric body 5. The piezoelectric body 5 contains a piezoelectric ceramic material, as in the first embodiment. The piezoelectric body 5 is, for example, constituted by a sintered body of a ceramic material. The piezoelectric element 1p is a laminated piezoelectric element.

The piezoelectric body 5 has a rectangular parallelepiped shape, as in the first embodiment. The piezoelectric body 5 includes a first main surface 5a and a second main surface 5b, a first end surface 5c and a second end surface 5d, and a first side surface 5e and a second side surface 5f. These surfaces are outer surfaces of the piezoelectric body 5.

The first main surface 5a and the second main surface 5b oppose each other in a first direction Bx1. For example, the piezoelectric body 5 is configured such that a plurality of piezoelectric layers is laminated, as in the first embodiment. A length of the piezoelectric body 5 along the first direction Bx1 is, for example, approximately 0.1 mm.

The first end surface 5c and the second end surface 5d oppose each other in a second direction Bx2 intersecting the first direction Bx1. The second direction Bx2 is, for example, a longitudinal direction of the piezoelectric body 5. A length of the piezoelectric body 5 along the second direction Bx2 is, for example, approximately 1.1 mm.

The first side surface 5e and the second side surface 5f oppose each other in a third direction Bx3 intersecting the first direction Bx1 and the second direction Bx2. The third direction Bx3 is, for example, a lateral direction of the piezoelectric body 5. A length of the piezoelectric body 5 along the third direction Bx3 is, for example, approximately 0.75 mm.

The first electrode 30 is an external electrode disposed on the outer surface of the piezoelectric body 5. The first electrode 30 may have the same layer structure and thickness as the first electrode 10 of the first embodiment and may be formed using the same forming method. The first electrode 30 includes a first electrode portion 31, a second electrode portion 32, and a third electrode portion 33. The first electrode portion 31 is disposed on the first main surface 5a. The second electrode portion 32 is disposed on the second end surface 5d. The third electrode portion 33 is disposed on the second main surface 5b. The first electrode portion 31 and the third electrode portion 33 oppose each other in the first direction Bx1. The first electrode portion 31, the second electrode portion 32, and the third electrode portion 33 are integrally formed on the outer surface of the piezoelectric body 5. The first electrode portion 31 and the second electrode portion 32 are coupled to each other at a ridge portion 6a formed with the first main surface 5a and the second end surface 5d. The second electrode portion 32 and the third electrode portion 33 are coupled to each other at a ridge portion 6b formed with the second end surface 5d and the second main surface 5b.

The first electrode portion 31 extends between an end edge of the first side surface 5e and an end edge of the second side surface 5f on the first main surface 5a. The first electrode portion 31 extends between an end edge of the second end surface 5d and an end edge of the first end surface 5c on the first main surface 5a, and is separated from the end edge of the first end surface 5c. The first electrode portion 31 includes an electrode end portion 31c located closer to the first end surface 5c. The electrode end portion 31c is separated from the first end surface 5c. An interval S31 between the electrode end portion 31c and the first end surface 5c in the second direction Bx2 is, for example, 10 µm to 100 µm. In a case where the interval S31 is within this range, a short circuit between the first electrode 30 and the second electrode 40 is prevented, and releasing of ceramics from the piezoelectric body 5 is effectively controlled. The second electrode portion 32 is disposed to cover the entirety of the second end surface 5d.

The third electrode portion 33 extends between an end edge of the first side surface 5e and an end edge of the second side surface 5f on the second main surface 5b. The third electrode portion 33 extends between an end edge of the second end surface 5d and an end edge of the first end surface 5c on the second main surface 5b, and is separated from the first end surface 5c. The third electrode portion 33 includes an electrode end portion 33c located closer to the first end surface 5c. The electrode end portion 33c is separated from the first end surface 5c. An interval S33 between the electrode end portion 33c and the first end surface 5c in the second direction Bx2 is, for example, 10 m to 100 µm. In a case where the interval S33 is within this range, a short circuit between the first electrode 30 and the second electrode 40 is prevented, and releasing of ceramics from the piezoelectric body 5 is effectively controlled. The first electrode 30 is not disposed on the first end surface 5c, on the first side surface 5e, and on the second side surface 5f.

The piezoelectric body 5 may include a surface that is in contact with the first electrode 30 and includes a sintered surface. In the present embodiment, the piezoelectric body 5 may include a surface that is in contact with the first electrode 30 and includes a sintered surface, and a surface that is in contact with the second electrode 40 and includes a sintered surface. The first main surface 5a may constitute the surface that is in contact with the first electrode 30 and includes a sintered surface. The second main surface 5b may constitute the surface that is in contact with the second electrode 40 and includes a sintered surface. The first electrode portion 31 of the first electrode 30 may be in contact with the first main surface 5a that is a sintered surface. The third electrode portion 33 may be in contact with the second main surface 5b that is a sintered surface.

The second electrode 40 includes an internal electrode 41. In the present embodiment, the piezoelectric element 1p includes only the internal electrode 41 as an internal electrode disposed in the piezoelectric body 5. The internal electrode 41 is formed in the piezoelectric body 5 to oppose the first electrode portion 31 and the third electrode portion 33 of the first electrode 30 in the first direction Bx1. The internal electrode 41 and the first electrode portion 31 are separated from each other. A distance between the internal electrode 41 and the first electrode portion 31 in the first direction Bx1 is, for example, 20 µm to 100 µm. The internal electrode 41 and the third electrode portion 33 are separated from each other. A distance between the internal electrode 41 and the third electrode portion 33 in the first direction Bx1 is, for example, 20 µm to 100 µm. The internal electrode 41 has, for example, a substantially rectangular shape when viewed in the first direction Bx1.

The internal electrode 41 is configured to extend in the piezoelectric body 5 between the first end surface 5c and the second end surface 5d in the second direction Bx2. The internal electrode 41 is exposed at the first end surface 5c and is separated from the second end surface 5d in the second direction Bx2. The internal electrode 41 includes a pair of electrode end surface 41c and electrode end surface 41d that oppose each other in the second direction Bx2. The electrode end surface 41c is exposed at the first end surface 5c of the piezoelectric body 5. The electrode end surface 41d is not exposed at the second end surface 5d of the piezoelectric body 5.

The electrode end surface 41d is separated from the second end surface 5d. A distance S41 between the electrode end surface 41d and the second end surface 5d in the second direction Bx2 is, for example, 10 µm to 100 µm. Since the electrode end surface 41d and the second end surface 5d are separated from each other by the distance S41, a short circuit between the internal electrode 41 and the first electrode 30 is prevented, and strain generated during polarization treatment in the piezoelectric element 1p and displacement during driving are balanced in a satisfactory manner.

The internal electrode 41 extends in the piezoelectric body 5 in the third direction Bx3. The internal electrode 41 includes a pair of electrode side surfaces 41e and electrode side surface 41f that oppose each other. In the present embodiment, the electrode side surface 41e is exposed at the first side surface 5e of the piezoelectric body 5. The electrode side surface 41f is exposed at the second side surface 5f of the piezoelectric body 5.

In the piezoelectric element 1p, the internal electrode 41 may be formed, for example, through simultaneous firing with the piezoelectric body 5. The internal electrode 41 is made of, for example, an Ag—Pd alloy. The internal electrode 41 is constituted by a sintered body of a conductive paste containing particles composed of Ag and Pd. In this Ag—Pd alloy electrode, a ratio of Ag and Pd is, for example, Ag:Pd=7:3. A material of the internal electrode 41 is not limited to the Ag—Pd alloy and may include, for example, Pt, Ag, Pd, Au, Cu, Ni, or alloys thereof. The internal electrode 41 may be constituted by a sintered body of a conductive paste containing these conductive materials. A thickness of the internal electrode 41 is, for example, 0.2 µm to 3 µm.

The piezoelectric body 5 may include a surface that is in contact with the internal electrode 41 and includes a sintered surface. The internal electrode 41 may be formed, for example, by simultaneous firing with the piezoelectric body 5. The surface of the piezoelectric body 5 in contact with the internal electrode 41 may be a sintered surface.

The second electrode 40 includes an external electrode 42. The external electrode 42 is disposed to cover the entirety of the first end surface 5c that is an outer surface of the piezoelectric body 5. The external electrode 42 is disposed to cover the entirety of the electrode end surfaces 41c of the internal electrode 41 exposed at the first end surface 5c. The internal electrode 41 is connected to the external electrode 42 at the first end surface 5c. The internal electrode 41 is electrically connected to the external electrode 42. The external electrode 42 opposes the second electrode portion 32 of the first electrode 30 in the second direction Bx2. The external electrode 42 is not disposed on the first main surface 5a, on the second main surface 5b, on the second end surface 5d, on the first side surface 5e, and on the second side surface 5f.

The external electrode 42 includes, for example, a Ni—Cr alloy layer and an Au layer that are laminated. In this case, the Ni—Cr alloy layer is formed on the piezoelectric body 5, and the Au layer is formed on the Ni—Cr alloy layer. The Ni—Cr alloy layer is a lower layer and the Au layer is an upper layer. The external electrode 42 has a Ni—Cr/Au laminated structure. The external electrode 42 may be, for example, a Ni—Cr alloy layer, an Au layer, a Cr layer, or a Ni layer. The external electrode 42 may have a single-layer structure. As a method for forming the external electrode 42, for example, a plating method is used. The plating method includes a sputtering method, a vapor deposition method, or an electrolytic plating method. In this embodiment, the external electrode 42 is a plating layer.

In a case where the external electrode 42 has a laminated structure, a thickness of the Ni—Cr alloy layer is, for example, 20 nm to 400 nm, and a thickness of the Au layer is 50 nm to 200 nm. In a case where the external electrode 42 has a single-layer structure, a thickness of the external electrode 42 is, for example, 70 nm to 600 nm. In the present embodiment, the piezoelectric body 5 is sandwiched between the first electrode 30 and the external electrode 42. The configuration where the first electrode 30 and the external electrode 42 sandwich the piezoelectric body 5, for example, reduces deformation of the piezoelectric body 5.

The first electrode 30 and the internal electrode 41 of the second electrode 40 are configured to apply the electric field to the piezoelectric body 5. Therefore, the piezoelectric element 1p includes the first electrode 30 and the internal electrode 41 that are a pair of electrodes that apply the electric field to the piezoelectric body 5.

In the piezoelectric element 1p, the piezoelectric body 5 includes an active region between the first electrode 30 and the internal electrode 41. The active region is displaced in response to the electric field applied to the piezoelectric element 1p. In this embodiment, in particular, the piezoelectric body 5 includes an active region EB1 and an active region EB2. The active region EB1 is positioned between the first electrode portion 31 of the first electrode 30 and the internal electrode 41. The active region EB2 is positioned between the third electrode portion 33 of the first electrode 30 and the internal electrode 41. The active region EB1 and the active region EB2 are positioned on both sides of the internal electrode 41 in the first direction Bx1.

The internal electrode 41 of the second electrode 40 is made of, for example, an Ag—Pd alloy, and hardness of the internal electrode 41 is low. The internal electrode 41 is sintered simultaneously with the piezoelectric body 5, for example, and thus a stress received by the piezoelectric body 5 from the internal electrode 41 tends to be small. Since the piezoelectric body 5 includes, near the internal electrode 41, a portion where the stress received from the electrode is small, the internal electrode 41 tends not to impede the displacement of the piezoelectric body 5. As a result, a displacement amount of the active region EB1 near the internal electrode 41 tends to be large. The first electrode 30 has, for example, a Ni—Cr/Au laminated structure, and hardness of the first electrode 30 is high. The first electrode 30 is obtained from forming a metal layer using a plating method after sintering, and a stress received by the piezoelectric body 5 from the first electrode 30 tends to be large. Since the piezoelectric body 5 includes, near the first electrode 30, a portion where the stress received from the electrode is large, the first electrode 30 tends to impede the displacement of the piezoelectric body 5. As a result, a displacement amount of the active region EB1 near the first electrode 30 tends to be small. In the present embodiment, the stress received by the piezoelectric body 5 from the first electrode 30 is larger than the stress received by the piezoelectric body 5 from the internal electrode 41. In this embodiment, the internal electrode 41 is a sintered metal layer.

A predetermined ion that migrates inside a crystal structure due to the polarization treatment tends to migrate from the first electrode portion 31 of the first electrode 30 toward the internal electrode 41 than from the internal electrode 41 toward the first electrode portion 31 of the first electrode 30. Accordingly, in a preparing process of the piezoelectric element 1p, an electric field is applied such that a polarization direction of the active region EB1 is a direction directed from the first electrode portion 31 of the first electrode 30 toward the internal electrode 41. A predetermined ion that migrates inside a crystal structure due to polarization treatment tends to migrate from the third electrode portion 33 of the first electrode 30 toward the internal electrode 41 than from the internal electrode 41 toward the third electrode portion 33 of the first electrode 30. Accordingly, in a preparing process of the piezoelectric element 1p, an electric field is applied such that a polarization direction of the active region EB2 is a direction directed from the third electrode portion 33 of the first electrode 30 toward the internal electrode 41. The predetermined ion is, for example, a B-site positive ion in the perovskite oxide represented by the general formula $ABO_X$. The polarization treatment is, for example, performed at an ordinary temperature.

As described above, in the present embodiment, the piezoelectric body 5 includes, between the first electrode 30 and the second electrode 40, two portions that are different from each other in the stress received from the electrodes. Of the two portions, one portion is a region that receives the stress from the first electrode 30, and the other portion is a region that receives the stress from the internal electrode 41 of the second electrode 40. The stress received by one portion from the first electrode 30 is greater than the stress received by the other portion from the internal electrode 41.

The polarization direction of the piezoelectric body 5 is a direction directed from the first electrode 30 toward the internal electrode 41 of the second electrode 40. Therefore, a configuration is realized in which the polarization direction is a direction directed from the one portion that receives the stress from the first electrode 30 toward the other portion that receives the stress from the internal electrode 41. As a result, the piezoelectric element 1p realizes the large amount of displacement and has high reliability.

In the piezoelectric element 1p, since the internal electrode 41 of the second electrode 40 is formed, for example, from simultaneous firing with the piezoelectric body 5, a sintering reaction also occurs in the internal electrode 41. In the internal electrode 41 made of a sintered metal layer formed through the sintering reaction, a plurality of holes tends to be formed in the internal electrode 41 because metal materials attract each other in a process of sintering the metal materials. Therefore, a portion that is not covered with the internal electrode 41 randomly occurs in the piezoelectric body 5, and coverage rate of the internal electrode 41 tends to be low. Since the first electrode 30 is formed using a plating method after firing, the first electrode 30 is dense, and a hole tends not to be formed in the first electrode 30. As a result, a portion that is not covered with the first electrode 30 tends not to occur in the piezoelectric body 5, and coverage rate of the first electrode 30 tends to be high.

In the present embodiment, the coverage rate of the first electrode 30 is larger than the coverage rate of the internal electrode 41 of the second electrode 40. For example, the coverage rate of the first electrode 30 is 95 to 100, and the coverage rate of the internal electrode 41 is 60 to 95. Therefore, the configuration where the coverage rate of the first electrode 30 is larger than the coverage rate of the internal electrode 41 of the second electrode 40 realizes in a simple and reliable manner the configuration where the stress received by the piezoelectric body 5 from the first electrode 30 is larger than the stress received by the piezoelectric body 5 from the internal electrode 41. In the piezoelectric element 1p, the stresses received by the piezoelectric body 5 from the electrodes are different because of differences in the material between the first electrode 30 and the internal electrode 41 of the second electrode 40, and the formation method. In the present embodiment, the stress received by the piezoelectric body 5 from the first electrode 30 constituted by a plating layer is larger than the stress received by the piezoelectric body 5 from the internal electrode 41 constituted by a sintered metal layer.

The piezoelectric body 5 includes a surface that is in contact with the first electrode 30 and includes a sintered surface, and a surface that is in contact with the second electrode 40 and includes a sintered surface. In this case, releasing of ceramics from the piezoelectric body 5 is controlled, and the piezoelectric body 5 is covered with the first electrode 30 and the second electrode 40 in an appropriate covering state.

EXAMPLES

Next, examples of the present invention will be described. The present invention is not limited to the following examples.

Example 1

(Preparation of Piezoelectric Element)

A process of preparing the piezoelectric element according to Example 1 is as follows.

First, a green sheet containing a piezoelectric ceramic material is prepared. The piezoelectric ceramic material includes PZT.

Next, the green sheet is fired to obtain a piezoelectric substrate. A thickness of the piezoelectric substrate is 0.08 mm.

Next, a laminated electrode film constituting a Ni—Cr/Au laminated structure is formed on one surface of the piezoelectric substrate. The laminated electrode film is formed using a sputtering method. In Example 1, in the formation of the laminated electrode film, an electrode film for a lower layer made of a Ni—Cr alloy is formed, and an electrode film for an upper layer made of Au is formed on the electrode film for the lower layer. A thickness of the electrode film for the lower layer is approximately 300 nm. A thickness of the electrode film for the upper layer is approximately 100 nm. The laminated electrode film formed on the one surface of the piezoelectric substrate is a laminated electrode film that constitutes the second electrode.

Next, a laminated electrode film constituting a Cr/Ni—Cr/Au laminated structure is formed on another surface of the piezoelectric substrate. The laminated electrode film is formed using a sputtering method. In Example 1, in the formation of the laminated electrode film, an electrode film for a lower layer made of Cr is formed, and an electrode film for an intermediate layer made of a Ni—Cr alloy is formed on the electrode film for the lower layer. Next, an electrode film for an upper layer made of Au is formed on the electrode film for the intermediate layer. A thickness of the electrode film for the lower layer is approximately 100 nm. A thickness of the electrode film for the intermediate layer is approximately 300 nm. A thickness of the electrode film for the upper layer is approximately 100 nm. The laminated electrode film formed on the other surface of the piezoelectric substrate is a laminated electrode film that constitutes the first electrode.

After forming the laminated electrode films, the piezoelectric substrate is subjected to polarization treatment. In the polarization treatment, the laminated electrode film constituting the first electrode is set as a positive electrode, the laminated electrode film constituting the second electrode is set as a negative electrode, and an electric field is applied to the piezoelectric substrate. The polarization treatment is performed at an ordinary temperature. After the polarization treatment, the piezoelectric substrate is cut to prepare individual piezoelectric elements. A size of the piezoelectric element is approximately 1.1 mm×0.75 mm×0.08 mm. In Example 1, the one surface of the piezoelectric substrate is a surface that constitutes the second main surface $3b$, and the other surface of the piezoelectric substrate is a surface that constitutes the first main surface $3a$.

(Evaluation of Element Characteristics)

Evaluation of the element characteristics was performed by the following process.

A magnitude of polarization (P [$\mu C/cm^2$]) in the piezoelectric element obtained through the above-described preparation process is measured. In this case, an AC electric field (V [kV/mm]) is applied to the piezoelectric element. The AC electric field is applied to the piezoelectric element at an ordinary temperature in a state where the first electrode is set as a positive electrode and the second electrode is set as a negative electrode.

Figure 5:
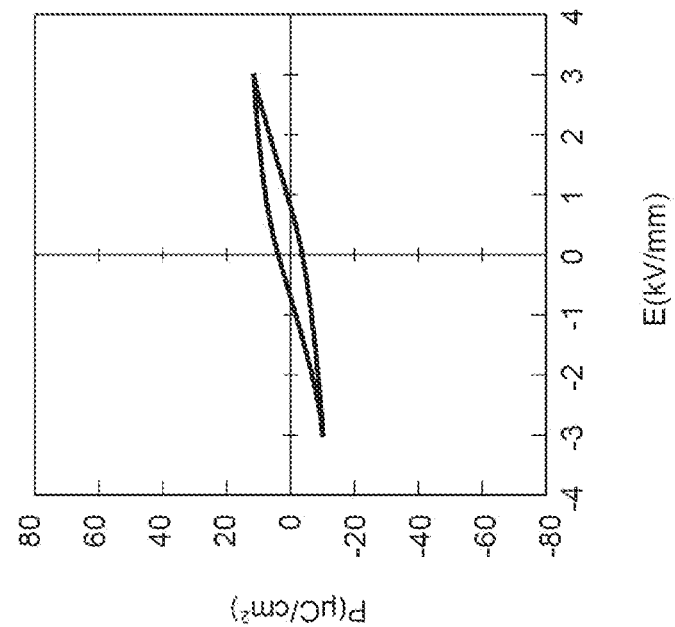
FIG. 5(a) and FIG. 5(b) are diagrams each illustrating a relationship between an electric field and polarization.
Figure 5:
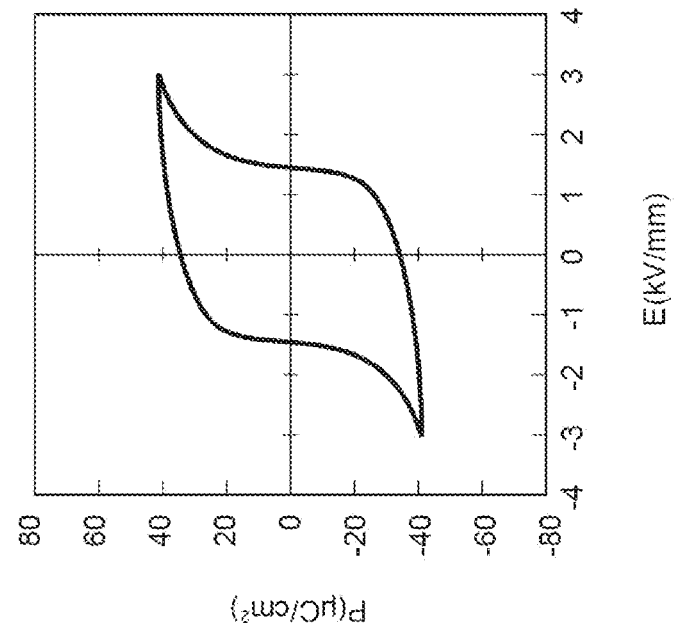

A measurement result is illustrated in FIG. 5($a$). FIG. 5($a$) is a diagram (hysteresis loop) illustrating a relationship between the electric field and the polarization according to Example 1, and is a result of polarization measurement. In Example 1, a large polarization was obtained and the hysteresis loop was substantially the same in all the measured piezoelectric elements.

(Evaluation of Reliability)

Evaluation of reliability was performed by the following process.

A driving test is performed on 10 piezoelectric elements obtained through the above-described preparation process. In the driving test, a rectangular wave voltage (alternating voltage) having a frequency of 500 Hz is applied to each of the piezoelectric element under an environment of 150° C. A peak value of the applied voltage is +30V. The above-described voltage is applied to the piezoelectric element in a state where the first electrode is set as a positive electrode and the second electrode is set as a negative electrode. Piezoelectric characteristics before and after the driving test for 500 hours are measured, and a variation in the piezoelectric characteristics after the driving test is determined.

From a result of determination, the variation in the piezoelectric characteristics in each of the 10 piezoelectric elements before and after the driving test is approximately 2% to 3%.

Comparative Example 1

(Preparation of Piezoelectric Element)

A process of preparing a piezoelectric element according to Comparative Example 1 is as follows.

In Comparative Example 1, the piezoelectric element is prepared through the same process as in Example 1 except for a condition for formation of the laminated electrode film constituting the first electrode. In Comparative Example 1, the laminated electrode film constituting the first electrode has the same material, layer structure, and thickness as the laminated electrode film constituting the second electrode. The laminated electrode film constituting the second electrode is an electrode film having a Ni—Cr/Au laminated structure.

Evaluation of Element Characteristics

Evaluation of the element characteristics was performed by the following process.

A magnitude of polarization (P [$\mu C/cm^2$]) of the piezoelectric element obtained through the above-described preparation process is measured in a similar manner as in evaluation of the element characteristics in Example 1. In this case as well, an AC electric field (V [kV/mm]) is applied to the piezoelectric element. The AC electric field is applied to the piezoelectric element in a state where the first electrode is set as a positive electrode and the second electrode is set as a negative electrode. The measurement is performed at an ordinary temperature.

A measurement result is illustrated in FIG. 5($b$). FIG. 5($b$) is a diagram illustrating a relationship between the electric field and the polarization according to Comparative Example 1, and is a result of polarization measurement. In Comparative Example 1, approximately 3% of all the piezoelectric elements have the piezoelectric characteristics like the one illustrated in FIG. 5(b). A magnitude of polarization obtained in the approximately 3% of all the piezoelectric elements is smaller than the magnitude of polarization obtained in the piezoelectric element of Example 1. In the remaining approximately 97% of the piezoelectric elements of Comparative Example 1, the same result as that of Example 1 is obtained as illustrated in FIG. 5(a).

(Evaluation of Reliability)

Evaluation of reliability was performed by the following process.

In a similar manner as in evaluation of reliability in Example 1, a driving test is performed on 10 piezoelectric elements obtained through the above-described preparation process. In the driving test, the above-described voltage is applied to the piezoelectric element in a state where the first electrode is set as a positive electrode and the second electrode is set as a negative electrode. Piezoelectric characteristics before and after the driving test for 500 hours are measured, and a variation in the piezoelectric characteristics after the driving test is determined.

From a result of determination, the piezoelectric characteristics of each of the 10 piezoelectric elements after the driving test are lowered by 10% to 15% as compared with the piezoelectric characteristics of each of the 10 piezoelectric elements before the driving test.

INDUSTRIAL APPLICABILITY

The present invention may be used for a piezoelectric element.

REFERENCE SIGNS LIST

1: piezoelectric element, 1p: piezoelectric element, 3: piezoelectric body, 5: piezoelectric body, 10: first electrode, 20: second electrode, 30: first electrode, 40: second electrode.

The invention claimed is:

1. A piezoelectric element comprising:
a piezoelectric body containing a piezoelectric ceramic material; and
a first electrode and a second electrode disposed on the piezoelectric body to oppose each other,
wherein
the piezoelectric body includes a region that overlaps with the first electrode and the second electrode in a direction orthogonal to the first electrode and the second electrode,
each of the first electrode and the second electrode includes a portion that overlaps with the region of the piezoelectric body in the direction orthogonal to the first electrode and the second electrode,
a stress received by the region of the piezoelectric body from the portion of the first electrode is larger than a stress received by the region of the piezoelectric body from the portion of the second electrode, and
a polarization direction of the region of the piezoelectric body is a direction directed from the portion of the first electrode toward the portion of the second electrode.

2. The piezoelectric element according to claim 1, wherein
a coverage rate of the first electrode is larger than a coverage rate of the second electrode.

3. The piezoelectric element according to claim 1, wherein
the piezoelectric body includes
a surface that is in contact with the first electrode and includes a sintered surface and
a surface that is in contact with the second electrode and includes a sintered surface.

4. The piezoelectric element according to claim 2, wherein
the piezoelectric body includes
a surface that is in contact with the first electrode and includes a sintered surface and
a surface that is in contact with the second electrode and includes a sintered surface.

5. The piezoelectric element according to claim 1, wherein
the first electrode has a hardness higher than a hardness of the second electrode.

6. A piezoelectric element comprising:
a piezoelectric body containing a piezoelectric ceramic material; and
a first electrode and a second electrode disposed on the piezoelectric body to oppose each other,
wherein
the first electrode has a hardness higher than a hardness of the second electrode,
a stress received by the piezoelectric body from the first electrode is larger than a stress received by the piezoelectric body from the second electrode, and
a polarization direction of the piezoelectric body is a direction directed from the first electrode toward the second electrode.

7. The piezoelectric element according to claim 6, wherein
a coverage rate of the first electrode is larger than a coverage rate of the second electrode.

8. The piezoelectric element according to claim 6, wherein
the piezoelectric body includes
a surface that is in contact with the first electrode and includes a sintered surface, and
a surface that is in contact with the second electrode and includes a sintered surface.

* * * * *